(12) United States Patent
Rubin et al.

(10) Patent No.: US 10,373,874 B2
(45) Date of Patent: Aug. 6, 2019

(54) MIDDLE OF THE LINE SUBTRACTIVE SELF-ALIGNED CONTACTS

(71) Applicant: INTERNATIONAL BUSINESS MACHINES CORPORATION, Armonk, NY (US)

(72) Inventors: Joshua M. Rubin, Albany, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/333,878

(22) Filed: Oct. 25, 2016

(65) Prior Publication Data
US 2017/0162437 A1 Jun. 8, 2017

Related U.S. Application Data

(62) Division of application No. 14/960,968, filed on Dec. 7, 2015, now Pat. No. 10,032,674.

(51) Int. Cl.
*H01L 27/088* (2006.01)
*H01L 21/8234* (2006.01)
(Continued)

(52) U.S. Cl.
CPC ........... *H01L 21/823475* (2013.01); *H01L 21/76805* (2013.01); *H01L 21/76843* (2013.01);
(Continued)

(58) Field of Classification Search
CPC . H01L 23/535; H01L 23/481; H01L 27/0886; H01L 29/41791; H01L 29/161; H01L 29/495; H01L 29/4966
(Continued)

(56) References Cited

U.S. PATENT DOCUMENTS 6,300,191 B1 * 10/2001 Yu ............... H01L 21/76831
257/E21.507
6,421,267 B1 * 7/2002 Kuo ................. G11C 16/0483
365/51
(Continued)

FOREIGN PATENT DOCUMENTS

JP        2000294794 A * 10/2000 ........... H01L 29/786
KR   10-2006-0077687        7/2006
(Continued)

OTHER PUBLICATIONS

Office action Appendix A: Translation into English of Tamaoki et al (JP-2000294794-A) obtained online dated Feb. 23 2018 from J-PLATPAT.*
(Continued)

*Primary Examiner* — Brook Kebede
(74) *Attorney, Agent, or Firm* — Tutunjian & Bitetto, P.C.; Vazken Alexanian (57) ABSTRACT

A method for forming contacts on a semiconductor device includes forming trenches by etching an etch stop layer formed on an interlayer dielectric and etching the interlayer dielectric to expose source and drain regions between gate structures and depositing conductive material in the trenches and over the etch stop layer to a height above the etch stop layer. A resist is patterned on the conductive material with shapes over selected source and drain regions. The conductive material is subtractively etched to remove the conductive material from over the etch stop layer and to recess the conductive material into the trenches without the shapes to form self-aligned contacts below the shapes and lines in the trenches.

16 Claims, 8 Drawing Sheets

(51) Int. Cl.
*H01L 29/49* (2006.01)
*H01L 21/768* (2006.01)
*H01L 29/161* (2006.01)
*H01L 29/417* (2006.01)
*H01L 23/535* (2006.01)

(52) U.S. Cl.
CPC .. *H01L 21/76883* (2013.01); *H01L 21/76885* (2013.01); *H01L 21/76895* (2013.01); *H01L 21/76897* (2013.01); *H01L 23/535* (2013.01); *H01L 27/0886* (2013.01); *H01L 29/161* (2013.01); *H01L 29/41791* (2013.01); *H01L 29/495* (2013.01); *H01L 29/4966* (2013.01); *H01L 21/823425* (2013.01); *H01L 21/823431* (2013.01)

(58) Field of Classification Search
USPC .................................................. 257/382, 401
See application file for complete search history.

(56) References Cited

U.S. PATENT DOCUMENTS

| | | | |
|---|---|---|---|
| 6,717,267 B1 * | 4/2004 | Kunikiyo | H01L 23/5283 257/758 |
| 6,911,395 B1 | 6/2005 | Qiao et al. | |
| 7,901,976 B1 | 3/2011 | Viswanathan et al. | |
| 8,026,606 B2 | 9/2011 | Luce et al. | |
| 8,357,609 B2 * | 1/2013 | Ryan | H01L 21/32139 257/E21.584 |
| 8,441,130 B2 | 5/2013 | Takeshima | |
| 8,704,343 B2 | 4/2014 | Ponoth et al. | |
| 8,742,529 B2 | 6/2014 | Sugimae et al. | |
| 8,969,197 B2 | 3/2015 | Edelstein et al. | |
| 9,312,356 B1 * | 4/2016 | Lin | H01L 29/4966 |
| 2002/0024106 A1 * | 2/2002 | Ootsuka | H01L 27/11 257/393 |
| 2002/0086504 A1 * | 7/2002 | Park | C23C 14/048 438/580 |
| 2008/0296778 A1 | 12/2008 | Roessiger et al. | |
| 2010/0221889 A1 * | 9/2010 | Youn | H01L 27/10811 438/396 |
| 2012/0313153 A1 * | 12/2012 | Zhang | H01L 29/1054 257/288 |
| 2013/0082382 A1 * | 4/2013 | Torii | H01L 21/76898 257/737 |
| 2013/0307150 A1 | 11/2013 | Edelstein et al. | |
| 2014/0210089 A1 | 7/2014 | Edelstein et al. | |
| 2014/0264479 A1 * | 9/2014 | Cai | H01L 29/401 257/288 |
| 2015/0035086 A1 * | 2/2015 | Xie | H01L 29/66545 257/411 |
| 2016/0099174 A1 * | 4/2016 | Wu | H01L 21/76808 438/618 |
| 2017/0012000 A1 * | 1/2017 | Tseng | H01L 23/535 |

FOREIGN PATENT DOCUMENTS

| | | |
|---|---|---|
| KR | 10-1035593 | 5/2011 |
| KR | 10-1146955 | 5/2012 |

OTHER PUBLICATIONS

List of IBM Patents or Patent Applications Treated as Related dated Oct. 25, 2016, 2 pages.

* cited by examiner

MIDDLE OF THE LINE SUBTRACTIVE SELF-ALIGNED CONTACTS

BACKGROUND

Technical Field

The present invention relates to semiconductor processing, and more particularly to devices and methods with self-aligned contacts formed using a subtractive etch to reduce contact resistance.

Description of the Related Art

Middle of the line (MOL) resistance characteristics have become one of the dominant performance detractors in scaling of semiconductor devices. Current solutions require significant material changes and materials research to attempt to reduce the contact resistance in MOL structures. One issue includes the increasing proportion of metal lines (higher resistivity) to bulk metals (lower resistivity) in vias. Many designs still employ contact liners in a 1×1 square via, which is most negatively impacted by the contact liners.

SUMMARY

A method for forming contacts on a semiconductor device includes forming trenches by etching an etch stop layer formed on an interlayer dielectric and etching the interlayer dielectric to expose source and drain regions between gate structures and depositing conductive material in the trenches and over the etch stop layer to a height above the etch stop layer. A resist is patterned on the conductive material with shapes over selected source and drain regions. The conductive material is subtractively etched to remove the conductive material from over the etch stop layer and to recess the conductive material into the trenches without the shapes to form self-aligned contacts below the shapes and lines in the trenches.

Another method for forming contacts on a semiconductor device includes forming an interlayer dielectric over gate structures and source and drain regions disposed between the gate structures; depositing an etch stop layer over the interlayer dielectric; patterning a first resist on the etch stop layer with windows formed in the first resist corresponding to the source and drain regions; forming trenches by etching the etch stop layer and the interlayer dielectric to expose the source and drain regions; depositing conductive material in the trenches and over the etch stop layer to a height above the etch stop layer; patterning a second resist on the conductive material with shapes over selected source and drain regions; subtractively etching the conductive material to remove the conductive material from over the etch stop layer and to recess the conductive material into the trenches without the shapes to form self-aligned contacts below the shapes and lines in the trenches; and removing the etch stop layer and the second resist.

A semiconductor device includes source and drain regions formed between gate structures. Conductive material is formed in trenches between the gate structures and to a height above the gate structures. The conductive material forms trench lines connected between source or drain regions disposed between the gate structures and self-aligned contacts on the trench lines. The conductive material is subtractively etched from a continuous portion of the conductive material to form the self-aligned contacts and the trenches lines in the trenches. The self-aligned contacts and the trenches lines are free of interfaces (e.g., monolithic) between the self-aligned contacts and the trench lines to avoid resistive losses.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, methods for forming a continuous trench silicide (TS)/self-aligned contact (CA) metal layer without an interface between the TS and the CA and with no liners on the CA are provided. A hybrid additive/subtractive approach is employed for forming liner-free interconnects, useful for 1×1 vias or bars. A TS trench is formed in an interlayer dielectric (ILD), a metal fill/overfill is employed for metallization, and CA interconnects are formed with a subtractive etch. The etch stops on an etch stop layer (ESL) or the ILD to create a line plus via combination (e.g., a hybrid damascene approach). The present principles employ ILD and TS trench etching to provide isolation in the hybrid additive/subtractive scheme, thereby enabling CA linerless interconnects of dissimilar dimensions from partially or fully-strapped (i.e., partially or full connected) TS connections. This enables independent design of line and via dimensions for a hybrid damascene-type process.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
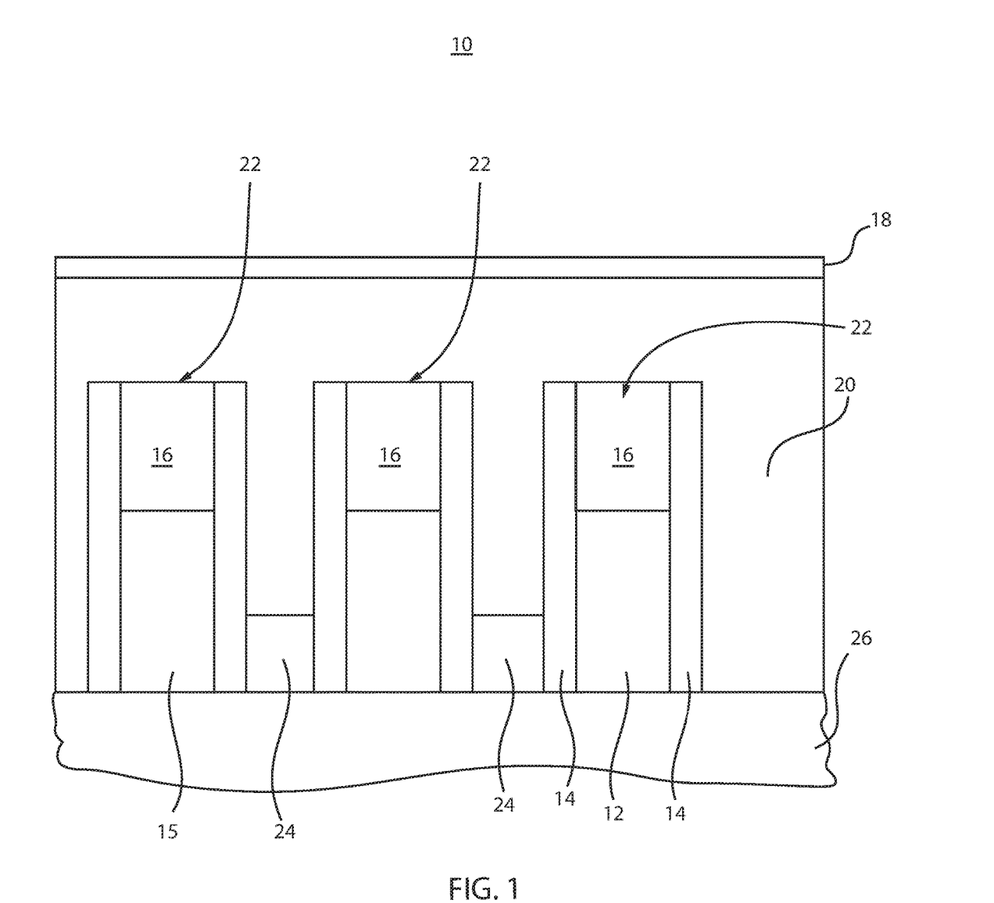
FIG. 1 is a cross-sectional view of a semiconductor device having source and drain regions formed between gate structures and having an etch stop layer formed on an interlayer dielectric in accordance with the present principles.

Referring now to the drawings in which like numerals represent the same or similar elements and initially to FIG. 1, an illustrative semiconductor device 10 is shown in accordance with the present principles. The device 10 includes one or more gate structures 22 formed over one or more fin structures 26. It should be understood that while the present principles will be illustratively described in terms of fin field effect transistors (finFETs) that the present principles are applicable to planar structures and other forms of FETs.

Fin 26 may include Si, SiGe or any other suitable semiconductor material. The gate structures 22 may include many different forms. In the illustrative embodiment shown, the gate structures 22 include a gate conductor 12 on a gate dielectric 15. The gate conductor 12 may include one or more conductive materials, such as, e.g., W, Al, TiC, TiN, etc. The gate dielectric 15 may include an oxide of the material of fin 26. The gate structures 22 may include spacers 14 and a self-aligned contact cap 16. The spacers 14 and the cap 16 include a dielectric layer and may include, e.g., silicon nitride or other dielectric materials.

In the embodiment shown, raised source/drain (S/D) regions 24 are disposed between the gate structures 22. The S/D regions 24 may be formed by epitaxial growth from the fin 26. The S/D regions 24 may include Si or materials including Si (e.g., SiGe). An interlevel dielectric (ILD) layer 20 is formed over the S/D regions 24 and the gate structures 22. The ILD layer 20 may include an oxide and may be formed using any suitable deposition process. A top surface of the ILD 20 is planarized, e.g., by a chemical mechanical polish (CMP) process. An etch stop layer (ESL) 18 is deposited on the ILD layer 20. The ESL 18 may include a nitride or other material that includes a different etch selectivity than the ILD layer 20.

Figure 2:
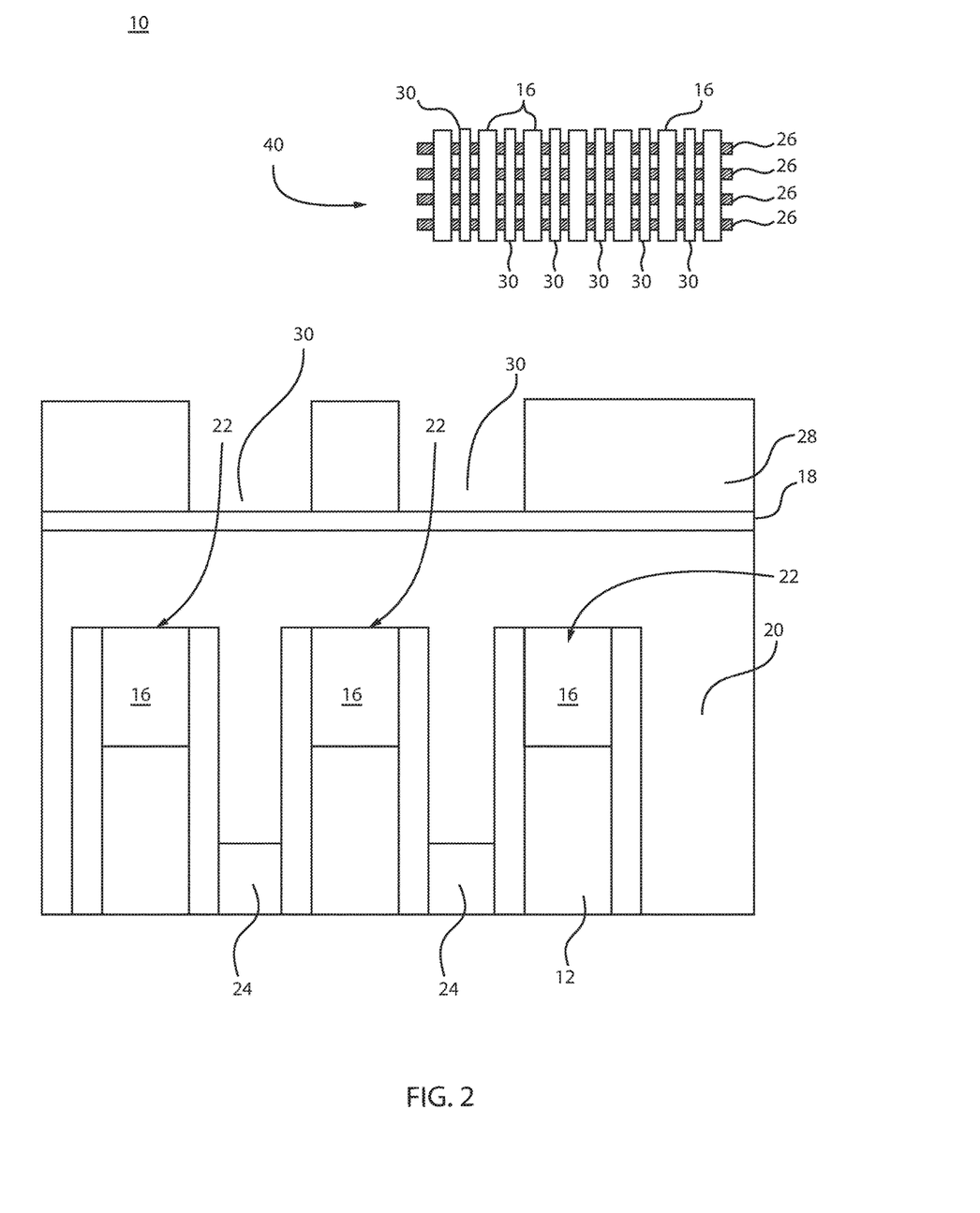
FIG. 2 is a cross-sectional view of the semiconductor device of FIG. 1 having a first resist formed on the etch stop layer and having windows opened corresponding with the source and drain regions and further showing a top view of the device in accordance with the present principles.

Referring to FIG. 2, a resist 28 is deposited on the ESL 18. The resist 28 may be spun onto the ESL 18. The resist may include an organic planarizing layer (OPL) or other useful material configured for lithography. The resist 28 is patterned to open up windows 30 over the S/D regions 24 and between gate structures 22. A top view 40 shows a transverse relationship between caps 16 (and gate structures 22) and fins 26. The top view 40 also shows windows 30 patterned for a trench silicide (TS) open etch process to be performed.

Figure 3:
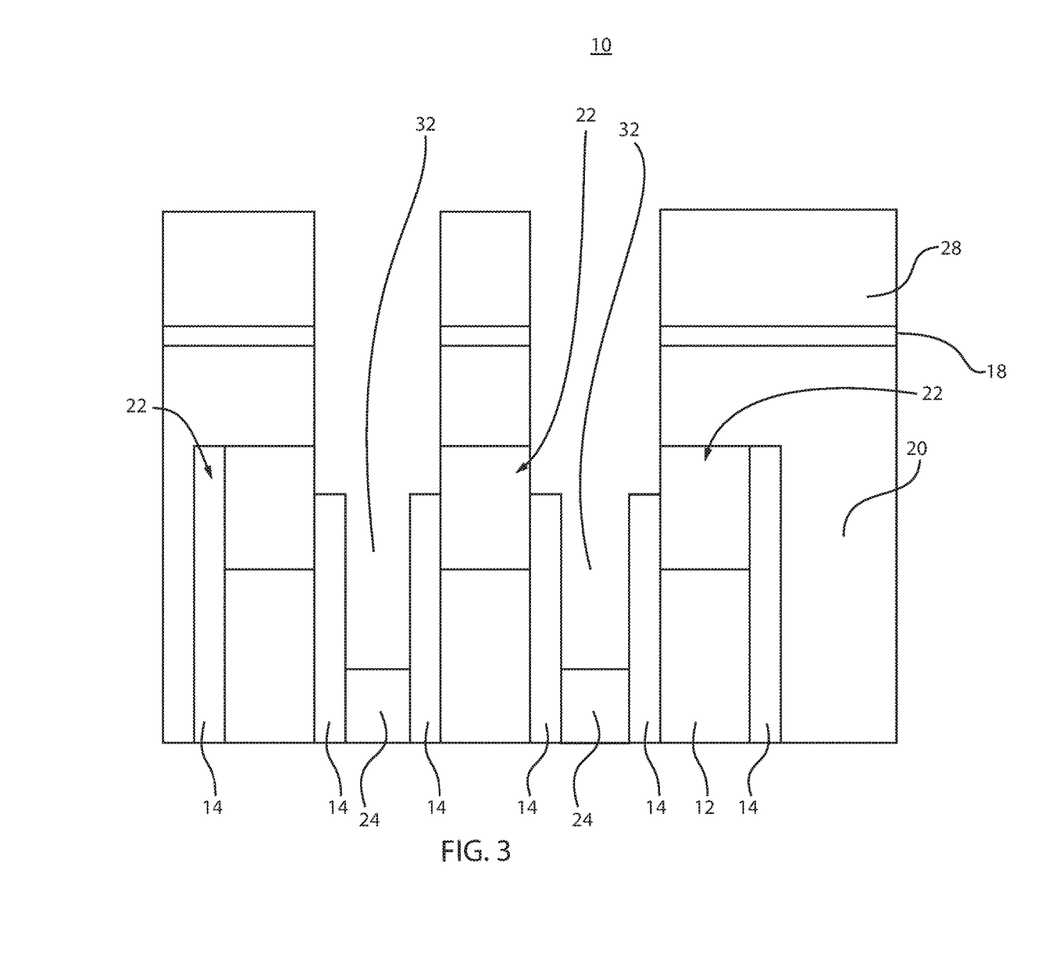
FIG. 3 is a cross-sectional view of the semiconductor device of FIG. 2 having trenches etched through the etch stop layer and the interlevel dielectric to expose the source and drain regions in accordance with the present principles.

Referring to FIG. 3, a TS open etch is performed to etch the ILD layer 20, the ESL 18 and a portion of the spacers 14 down to the S/D regions 24. The S/D regions 24 are exposed by the etch. The etch may include a reactive ion etch (RIE) process although other etch processes may be employed. The etch forms TS trenches 32.

Figure 4:
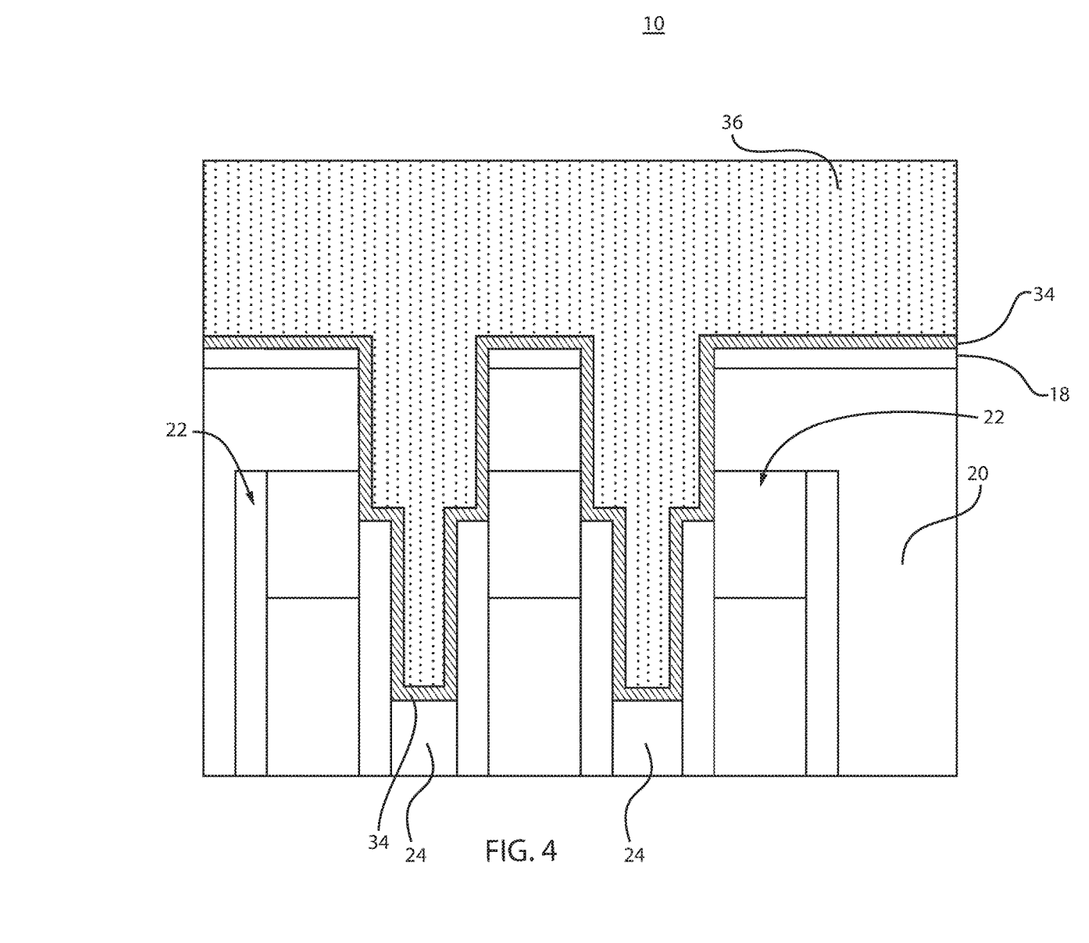
FIG. 4 is a cross-sectional view of the semiconductor device of FIG. 3 showing the trenches filled with a conductive material, the conductive material being formed over the etch stop layer in accordance with the present principles.

Referring to FIG. 4, the TS trenches 32 are lined with a liner 34. The liner 34 is conformally deposited on the exposed areas of the device 10. The liner 34 provides a diffusion barrier and may include a material, such as, e.g., TiN, TaN or other suitable material. A conductive material 36 is deposited over the liner 34 and fills/overfills the TS trenches 32 and a top surface of the device 10.

The conductive material 36 may form both vias and lines concurrently in a single deposition. The conductive material 36 is therefore formed to a thickness above the ESL 18 that is sufficient to form a self-aligned contact (CA) down to the S/D regions 24. The TS trenches 34 may have been formed in lines and may include vias such that the conductive material deposition provides a continuous block of material in an additive process. This reduces the number of interfaces between different layers of materials and assists in reducing resistance in middle of the line (MOL) metallization structures. The conductive material 36 may include a metal such as, e.g., W, Al, Ti, Au, etc.

Figure 5:
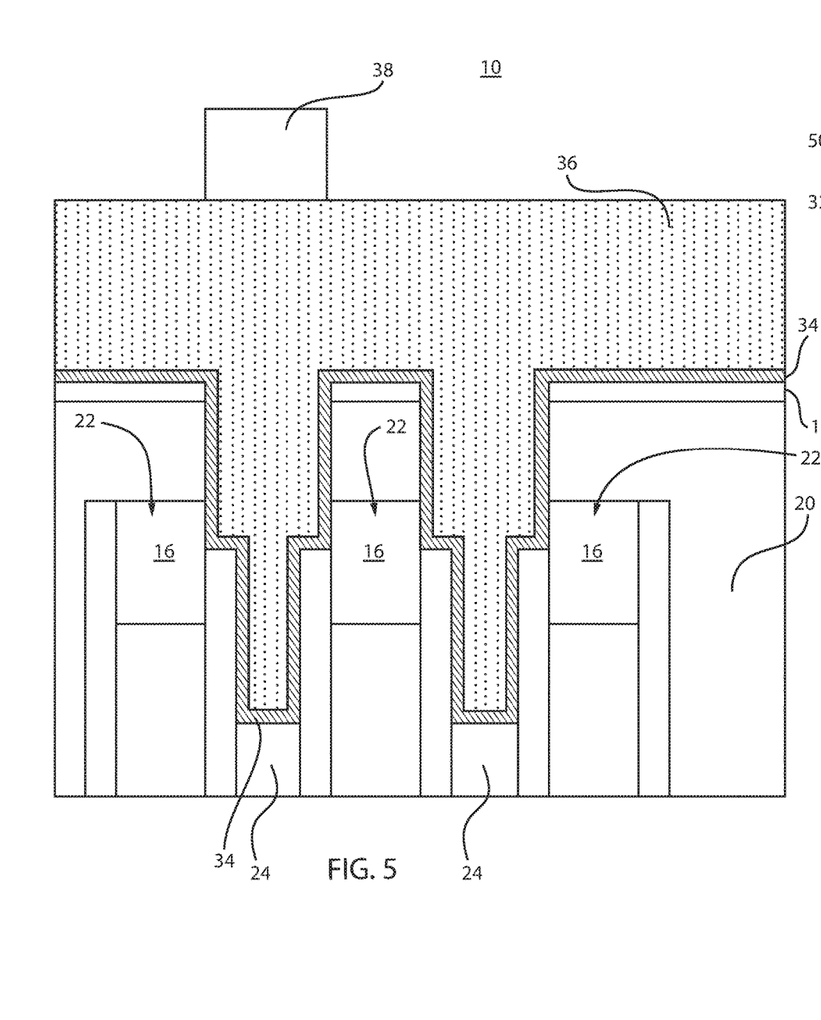
FIG. 5 is a cross-sectional view of the semiconductor device of FIG. 4 showing a second resist formed over selected trenches filled with the conductive material in accordance with the present principles.

Referring to FIG. 5, a resist 38 is formed over the conductive material 36. The resist 38 may be spun onto the conductive material 36. The resist 38 may include an OPL or other useful material configured for lithography. The resist 38 is patterned over portions of the conductive material 36 that are to be preserved after a subtractive etch process that removes the conductive material 36 from regions of the device 10 not protected by the resist 38. The subtractive etch may include a RIE or other suitable etching process to remove the conductive material selective to the ESL 18. Since resist 38 is patterned by lithography, a number of different etch arrangements can be configured. For example, FIGS. 6 and 7 show example configurations for the conductive material 36 as patterned by the resist 38.

Figure 6:
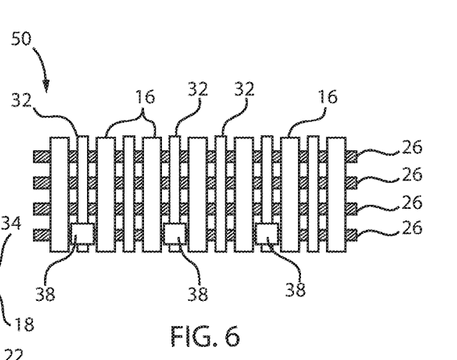
FIG. 6 is a top view of the semiconductor device of FIG. 5 showing the second resist formed over one fin in accordance with the present principles.

Referring to FIG. 6, a top view 50 of the device 10 is illustratively shown in accordance with one embodiment. The top view 50 does not show the conductive material 36 so that relationships with other structures may be seen. Here, the resist 38 is formed over the TS trenches 32 between gate structures (caps 16) and over a fin 26.

Figure 7:
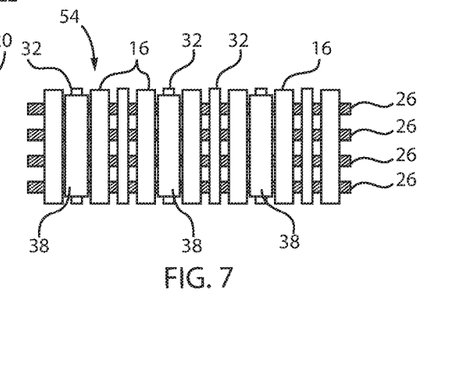
FIG. 7 is a top view of the semiconductor device of FIG. 5 showing the second resist formed over a plurality of fins in a line in accordance with the present principles.

Referring to FIG. 7, another top view 54 of the device 10 is illustratively shown in accordance with another embodiment. The top view 54 does not show the conductive material 36 so that relationships with other structures may be seen. Here, the resist 38 is formed over and extends along the TS trenches 32 between gate structures (caps 16) and over multiple fins 26.

Figure 8:
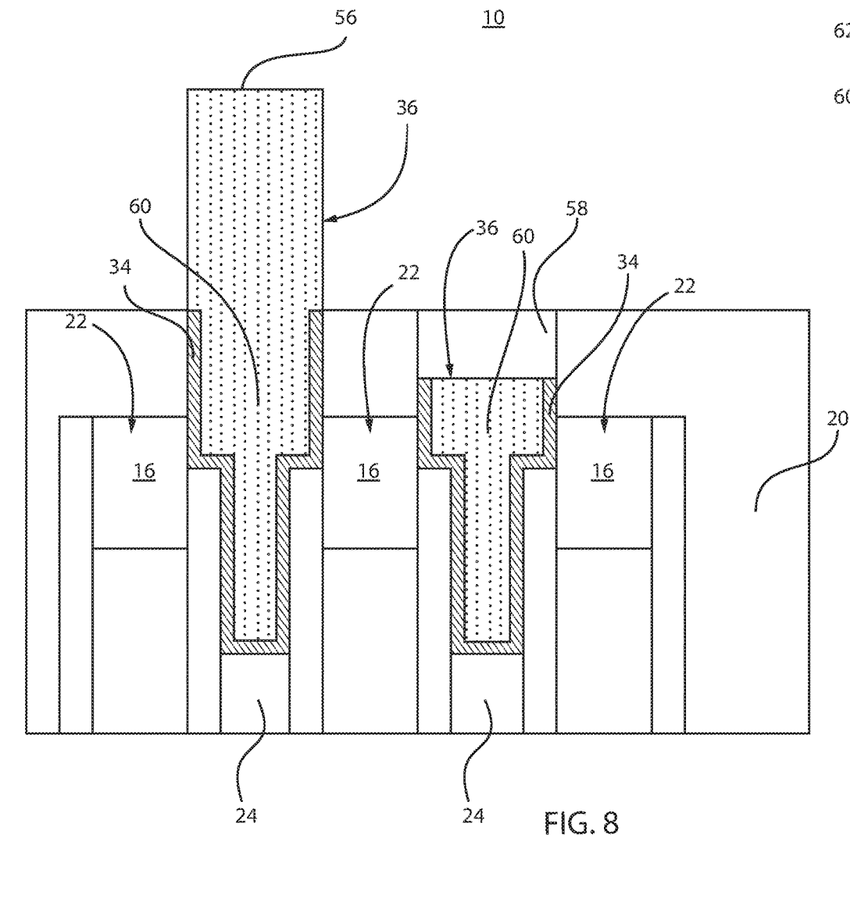
FIG. 8 is a cross-sectional view and a top view of the semiconductor device of FIG. 5 showing the conductive material subtractively etched to form monolithic contact/line structures in accordance with the present principles.

Referring to FIG. 8, a subtractive etch process is performed to remove conductive material 36 to form contacts 56 and lines or bars 60. The etch process etches the conductive material 36 with respect to the resist 38. The contacts 56 (e.g., CA) are taller and extend above the lines or bars 60, which are formed in the TS trenches. The subtractive etch process stops on the ESL 18. Then, another etch process removes the ESL 18. A remaining resist 38 is removed from the contacts 56. The subtractive etch process preferably etches the lines 60 without CA contacts 56 thereon into recesses 58.

A top view 62 of the device 10 illustratively shows the relationships between the contacts 56 and lines 60 with other structures. Here, the contacts 56 are formed over lines 60 as a continuous material. The lines 60 extend along the TS trenches 32 between gate structures (caps 16) and over multiple fins 26 making contact with S/D regions 24 below the lines 60.

Figure 9:
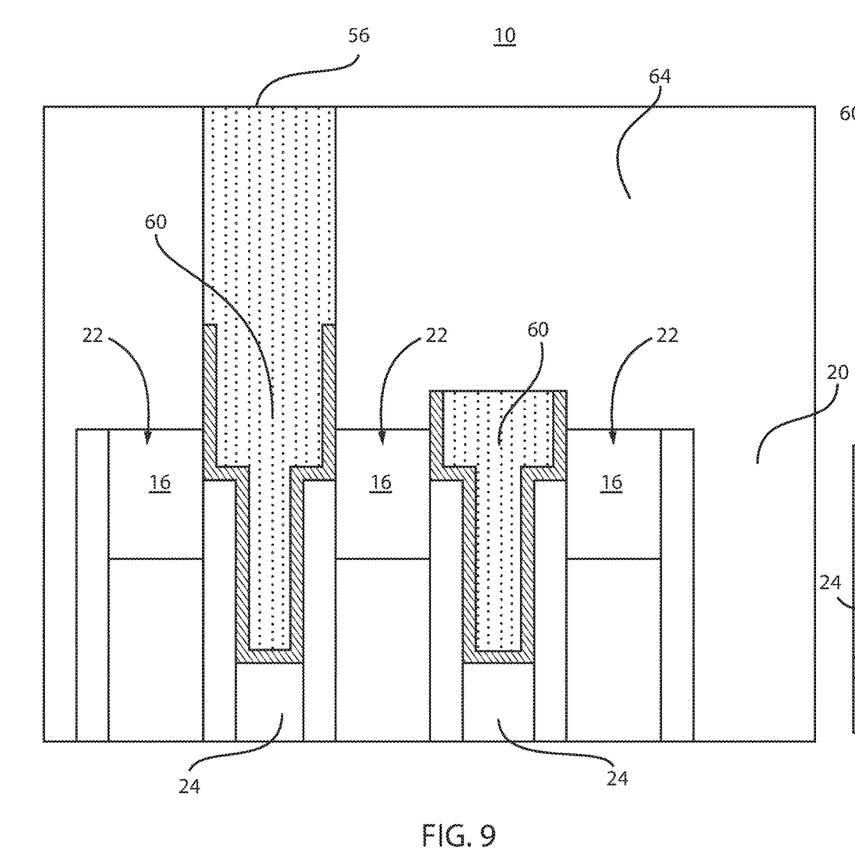
FIG. 9 is a cross-sectional view of the semiconductor device of FIG. 8 showing the interlevel dielectric layer extended to a height of the contacts in accordance with the present principles.

Referring to FIG. 9, the ILD 20 is extended with an ILD 64 fill and further deposition. The ILD 64 preferably includes a same material as ILD 20, although any suitable dielectric material may be employed.

Figure 10:
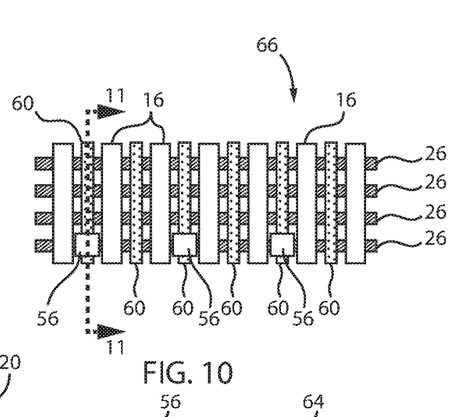
FIG. 10 is a top view of the semiconductor device of FIG. 9 showing the contacts and lines formed by a hybrid damascene process in accordance with the present principles.

Referring to FIG. 10, a top view 66 illustratively shows the relationships between the contacts 56 and lines 60 with other structures for the structure of FIG. 9. The contacts 56 formed over lines 60 as a continuous material are depicted without the ILD 64 for illustration purposes. The lines 60 extend along the TS trenches 32 between gate structures (caps 16) and over multiple fins 26 making contact with S/D regions 24 below the lines 60. A cross-section line 11-11 is indicated.

Figure 11:
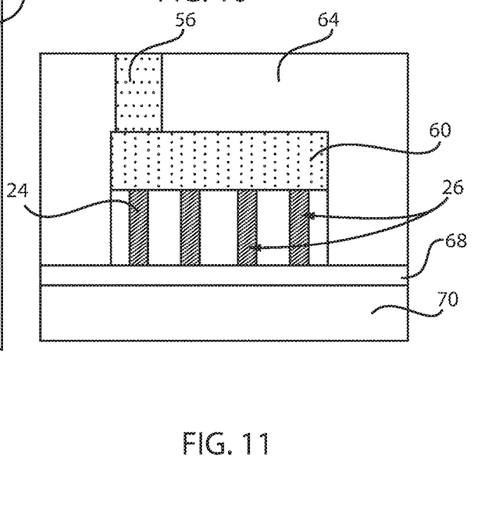
FIG. 11 is a cross-sectional view taken at section line 11-11 of FIG. 10 showing the contact and lines formed in accordance with one embodiment.

Referring to FIG. 11, the cross-section taken at section line 11-11 of FIG. 10 shows a contact 56 and a line 60 formed over fins 26 and S/D regions 24 (indicated collectively as fins 26). In this embodiment, the fins 26 are formed on a buried dielectric layer 68, such as a buried oxide. The buried dielectric layer 68 is formed on a substrate 70. The device 10 may be formed using a semiconductor-on-insulator (SOI) substrate although a bulk substrate processed to have a similar or different structure may be employed. The lines 60 and 56 have been formed from a same material and therefore include minimal contact resistance therebetween (no interface). In addition, trench silicide contacts are formed as lines 60 and include a continuous conductive material. The lines 60 extend along the TS trenches 32 between gate structures (caps 16) and over multiple fins 26 making contact with S/D regions 24 below the lines 60.

The hybrid damascene process forms a line 60 with a contact 56 thereon. The self-aligned contacts 56 and their corresponding lines 60 are free of interfaces and liners to avoid resistive losses. There is no contact resistance between TS contacts and CA contacts and no intermittent liners. The self-aligned contacts 56 and their corresponding lines 60 can be independently sized having different widths, heights and relative proportions. The self-aligned contacts may have a different size than their corresponding lines. The contacts 56 may include a width of, e.g., 7 nm while the lines may include a width of, e.g., 14 nm. In other embodiments, the contacts 56 may include a width of, e.g., 20 nm and the lines 60 may include a width of, e.g., 14 nm. Other dimension combinations are also contemplated.

Figure 12:
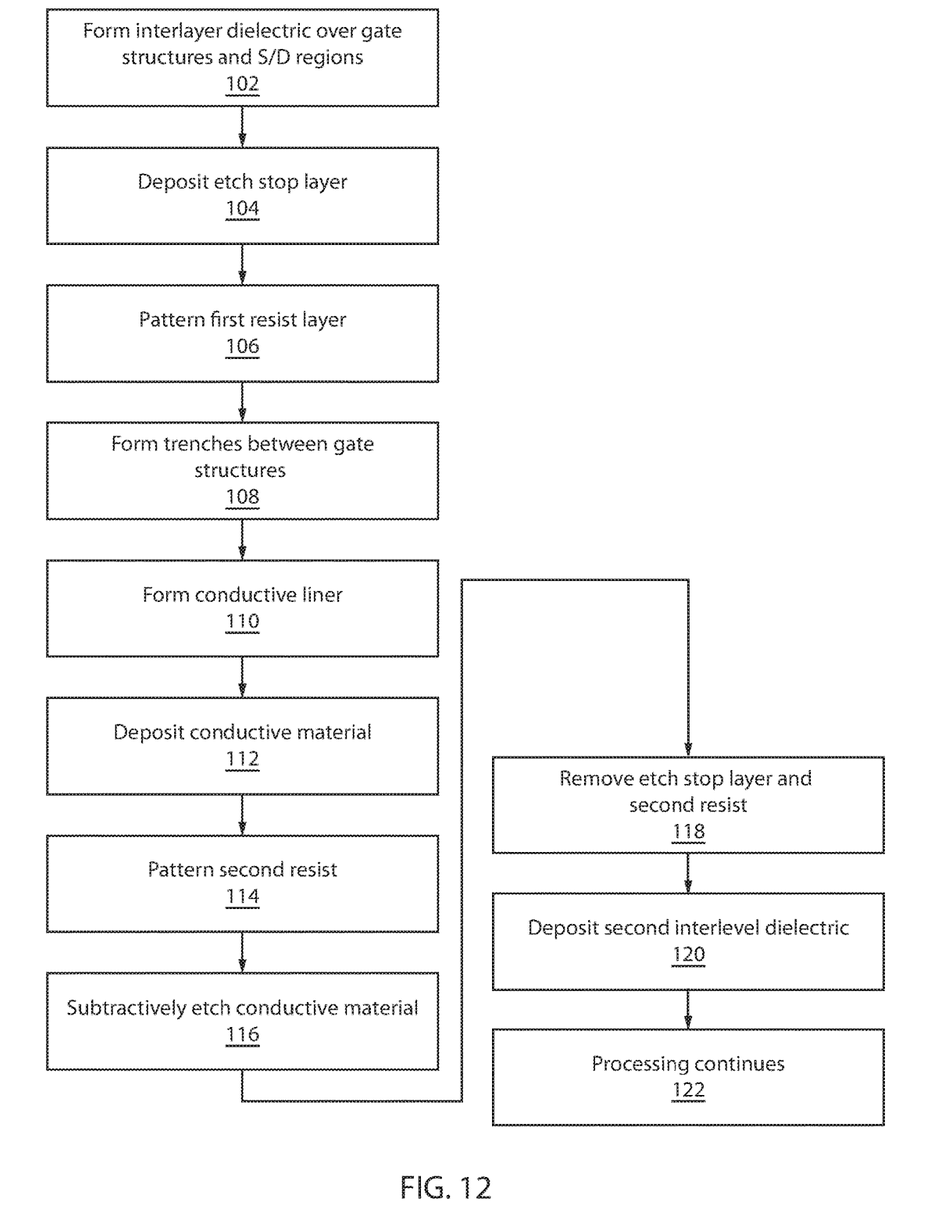
FIG. 12 is a block/flow diagram showing methods for forming contacts on a semiconductor device in accordance with illustrative embodiments.

Referring to FIG. 12, methods for forming contacts on a semiconductor device are shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, an interlayer dielectric is formed over gate structures and source and drain regions disposed between the gate structures. The interlayer dielectric may include an oxide. The source and drain regions may be formed on a fin or on a substrate for a planar device. The fin may be formed on a bulk substrate or SOI substrate. The source and drain regions may be epitaxially grown on a fin (or other semiconductor layer or material).

In block 104, an etch stop layer (ESL) is deposited over the interlayer dielectric. The ESL may include a silicon nitride. In block 106, a first resist is patterned on the etch stop layer with windows formed in the first resist corresponding to the source and drain regions. The resist may include an OPL material. In block 108, trenches are formed by etching through the etch stop layer and into the interlayer dielectric to expose the source and drain regions.

In block 110, a conductive liner is formed in the trenches before depositing a conductive material. In block 112, conductive material is deposited in the trenches and over the etch stop layer to a height above the etch stop layer. The deposition is an additive process that covers all exposed surfaces. In block 114, a second resist is patterned on the conductive material with shapes over selected source and drain regions. The shapes define regions where conductive material will remain. The shapes may include contact shapes or line shapes (or a combination thereof).

In block 116, the conductive material is subtractively etched to remove the conductive material from over the etch stop layer and to recess the conductive material into the trenches (without the shapes) to form self-aligned contacts below the shapes and lines in the trenches. The lines may contact a plurality of source regions or plurality of drain regions in the trenches. In another embodiment, the self-aligned contacts are formed in lines over trench lines crossing over a plurality of semiconductor fins.

The present principles permit the self-aligned contacts and their corresponding lines to be free of interfaces and/or liners between them to avoid resistive losses. The self-aligned contacts and their corresponding lines can be independently sized such that the self-aligned contacts have a different size than their corresponding lines.

In block 118, the etch stop layer and the second resist are removed. In block 120, a second interlayer dielectric is deposited to fill up to the height and isolate the self-aligned contacts. In block 122, processing continues with the formation of other metallizations and dielectric layers to complete the device.

Having described preferred embodiments for middle of the line subtractive self-aligned contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
first and second gate structures;
a source/drain region formed between the first and second gate structures; and
a continuous portion of conductive material formed in a trench located above the source/drain region between the first and second gate structures and to a height above the first and second gate structures, the continuous portion of conductive material monolithically forming a trench line disposed over a plurality of semiconductor fins and a self-aligned contact disposed directly on the trench line over a single semiconductor fin;
the self-aligned contact and the trench line being free of interfaces between the self-aligned contact and the trench line to avoid resistive losses.

2. The device as recited in claim 1, further comprising a liner formed in the trench on which the continuous portion of conductive material is formed.

3. The device as recited in claim 2, wherein the liner is disposed between and in direct contact with the source/drain regions and the trench lines.

4. The device as recited in claim 2, wherein the liner extends along sidewalls of the trench line and the self-aligned contact is linerless.

5. The device as recited in claim 2, wherein the liner includes TiN.

6. The device as recited in claim 1, further comprising an interlevel dielectric layer formed to the height to isolate the self-aligned contact.

7. The device as recited in claim 1, wherein the self-aligned contact has a different size than the trench line.

8. The device as recited in claim 1, wherein the device is included within an integrated circuit.

9. The device as recited in claim 1, wherein each of the gate structures includes a gate conductor on a gate dielectric, and wherein the gate conductor includes at least one material selected from the group consisting of: W, Al, TiC, and TiN.

10. A semiconductor device, comprising: first and second gate structures; a source/drain region formed between the first and second gate structures; a liner formed in a trench located above the source/drain region between the first and second gate structures; a continuous portion of conductive material formed in on the liner in the trench to a height above the first and second gate structures, the continuous portion of conductive material monolithically forming a trench line and a self-aligned contact disposed directly on the trench line, wherein the liner extends along sidewalls of the trench line and the self-aligned contact is linerless, and wherein the self-aligned contact is disposed over a single semiconductor fin and the trench line is disposed over a plurality of semiconductor fins; the self-aligned contact and the trench line being free of interfaces between the self-aligned contact and the trench line to avoid resistive losses.

11. The device as recited in claim 10, further comprising an interlevel dielectric layer formed to the height to isolate the self-aligned contact.

12. The device as recited in claim 10, wherein the self-aligned contact has a different size than the trench line.

13. The device as recited in claim 10, wherein the liner is disposed between and in direct contact with the source/drain regions and the trench lines.

14. The device as recited in claim 10, wherein the device is included within an integrated circuit.

15. The device as recited in claim 10, wherein each of the gate structures includes a gate conductor on a gate dielectric, and wherein the gate conductor includes at least one material selected from the group consisting of: W, Al, TiC, and TiN.

16. The device as recited in claim 10, wherein the liner includes TiN.

* * * * *